United States Patent [19]

Katanosaka

[11] Patent Number: 4,897,817
[45] Date of Patent: Jan. 30, 1990

[54] SEMICONDUCTOR MEMORY DEVICE WITH A BUILT-IN TEST CIRCUIT

[75] Inventor: Naoki Katanosaka, Tokyo, Japan

[73] Assignee: NEC Corporation, Tokyo, Japan

[21] Appl. No.: 195,391

[22] Filed: May 10, 1988

Related U.S. Application Data

[63] Continuation of Ser. No. 835,085, Feb. 28, 1986, abandoned.

[30] Foreign Application Priority Data

Feb. 28, 1985 [JP] Japan .................................. 60-39136

[51] Int. Cl.[4] ............................................. G11C 29/00
[52] U.S. Cl. .................................................... 365/201
[58] Field of Search ........................................ 365/201

[56] References Cited

U.S. PATENT DOCUMENTS

4,337,522 6/1982 Stewart ................................ 365/190
4,744,061 5/1988 Takemae ............................. 365/201

Primary Examiner—James W. Moffitt
Attorney, Agent, or Firm—Sughrue, Mion, Zinn, Macpeak & Seas

[57] ABSTRACT

A semiconductor memory device provided with an on-chip test circuit is disclosed. The on-chip test circuit includes a test write circuit for writing the same write data to at least two memory cells, simultaneously in a test mode, a selection circuit for simultaneously reading stored data from the above at least two memory cells and a comparison circuit for comparing data read from the at least two memory cells whose comparison output shows whether at least one of the at least two memory cells is bad, or all of the at least two memory cells are good.

5 Claims, 3 Drawing Sheets

SEMICONDUCTOR MEMORY DEVICE WITH A BUILT-IN TEST CIRCUIT

This is a continuation of application Ser. No. 835,085, filed Feb. 28, 1986, now abandoned.

BACKGROUND OF THE INVENTION

The present invention relates to a semiconductor memory device, and particularly to a semiconductor memory device provided with an on-chip or built-in test circuit.

The capacity of semiconductor memories has been increasing remarkably, and memory having 256 kbit are currently manufactured. Also, many prototype one megabit dynamic memories have been announced. However, accompanied by the increase in memory capacity, the test time for testing memories also has been increased.

In order to determine whether a memory is good or not, it is necessary to check all the memory cells. The test of a memory is conducted by writing a predetermined one of binary logic data into each memory cell and reading stored data from each memory cell. If the predetermined one of binary logic data is read from one memory cell, this one memory cell is judged as a good cell. If a logic data other than the above predetermined logic data is read from one memory cell, then this one memory cell is judged as a default cell. This testing is conducted for all the memory cells.

The above kind of test must be performed under varying conditions of power supply voltge, timing of signals or the like. Thus, the test time has been increased largely in proportion to the capacity of memories. For example, a typical test time required for a 64-Kbit memory is 3.2 second, while the test times for a 256-Kbit memory and a 1-Mbit memory are 12.8 seconds and 51.2 seconds, respectively. The increase in test time also has increased the cost of manufacturing memories.

SUMMARY OF THE INVENTION

It is an object of the present to provide a memory with an on-chip test circuit for conducting a test of the memory at a high speed.

The memory of the present invention is of the type having a plurality of memory cells which are divided into a plurality of memory cell groups, a plurality of bus lines each provided for each one of the memory cell groups, and a plurality of selection circuits provided for the plurality of memory cell groups, each selection circuit selectively performing a transfer of data between one of the data lines of the associated memory cell group and the associated bus line. The memory features a test write circuit for simultaneously providing the same data to the plurality of bus lines for writing the same data to selected memory cells of the respective memory cell groups, and a comparison circuit for comparing data read from the selected memory cells of the respective memory cell groups.

According to the present invention, a plurality of memory cell groups are simultaneously subjected to writing of the same data and to reading of written data for test purposes. In this manner the total test time for a memory cell device can be significantly reduced. Furthermore, examination of the read-out data from the memory cells to be checked is conducted by simply comparing the read-out data from those cells. Accordingly, a high speed checking of the memory cells can be achieved by a simple circuit arrangement.

DETAILED DESCRIPTION OF THE INVENTION

Figure 1:
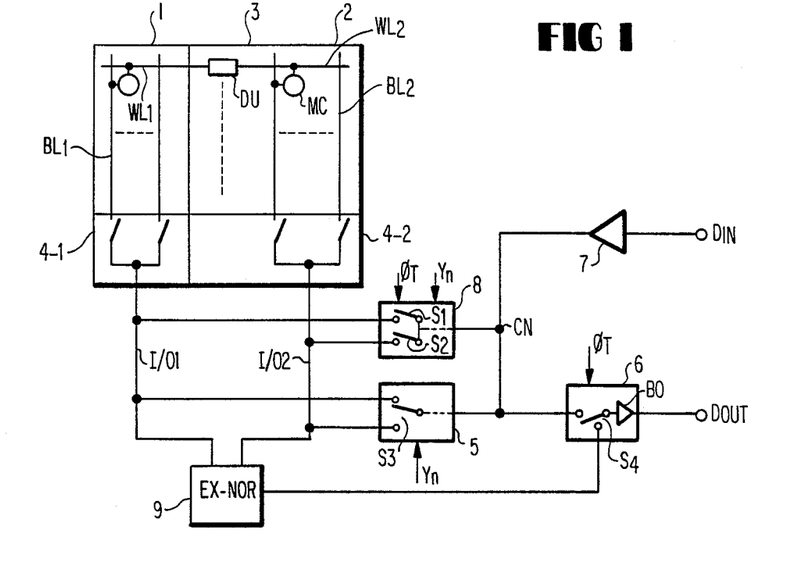
FIG. 1 is a schematic block diagram showing a memory device according to a first embodiment of the present invention.

FIG. 1 shows a memory according to a first embodiment of the invention. A plurality of memory cells are arranged in two memory cell arrays 1 and 2 in a known manner. In each of the arrays 1 and 2, a plurality of word lines WL1, WL2 are arranged in rows and adapted to be selected by a row decoder DU in a row decoding section 3. Bit lines BL1 in the array 1 are selected by a column selection circuit 4-1 to be connected to a first bus line I/O 1, while bit lines BL2 in the array 2 are selected by a column selection circuit 4-2 to be connected to a second bus line I/O 2. A plurality memory cells MC are connected to word lines and bit lines in a known manner. In this arrangement, the decoder DU is used to select simultaneously both word lines WL1 and WL2 of the arrays 1 and 2. Also, the column selection circuits 4-1 and 4-2 operate simultaneously.

A data input terminal $D_{IN}$ is connected to an input of a data-in buffer 7. An output circuit 6 includes a buffer BO whose output is connected to an output terminal $D_{OUT}$. The output circuit 6 also includes a switch S4. The switch S4 connects the input of the buffer BO to a node CN when a test signal $\phi_T$ is not present in a normal operating mode, and to an output of an Exclusive-NOR circuit 9 when the test signal $\phi_T$ is present in a test mode. The Exclusive-NOR circuit has two inputs coupled to the bus lines I/O 1 and I/O 2, respectively. A write block selection circuit 8 includes a switch S1 connected between the bus line I/O 1 and the node CN and a switch S2 connected between the bus line I/O 2 and the node CN. In a normal write operation mode ($\phi_T$ is not present), one of the switches S1 and S2 assumes a conductive state according to a column address bit Yn, while both of the switches S1 and S4 are rendered conductive in response to the signal $\phi_T$ so that the same write data from the terminal $D_{IN}$ is applied to both the bus lines I/O 1 and I/O 2 simultaneously. Then the write data on the bus lines I/O 1 and I/O 2 are transmitted to selected bit lines through the column selection circuits 4-1 and 4-2 to write the same data to selected memory cells in both arrays 1 and 2 in a write cycle in the test mode. A read block selection circuit 5 includes a switch S3 which connects one of the bus lines I/O 1 and I/O 2 to the node CN in response to the same column address bit Yn.

A read operation in the normal operating mode is explained first. A read-out data from a selected memory cell in the array 1 is outputted to the bus line I/O 1 via the circuit 4-1 while a read-out data from a selected memory cell in the array 2 is outputted to the bus line I/O 2 via the circuit 4-2.

Then, the switch S3 connects one of I/O 1 and I/O 2 to the node CN according to Yn so that a selected one of data on the bus lines I/O 1 and I/O 2 is transmitted to the node CN. In this instance the switch S4 connects the node CN to the input of BO, and hence the selected data on the node CN is outputted to the output terminal $D_{OUT}$. The switch S3 does not connect either of I/O 1 and I/O 2 to the node CN.

When a write operation is conducted in the normal operation mode, the buffer 7 is enabled so that write data applied to $D_{IN}$ is amplified and outputted to the node CN. In this instance, one of the switches S1 and S2 in the circuit 8 is rendered conductive according to the content of Yn so that the write data on the node CN is selectively transferred to one of I/O 1 and I/O 2 and then written into one of the arrays 1 and 2.

When a write operation is conducted in the test mode, both the switches S1 and S2 are made conductive in response to $\phi_T$, while the switch S4 connects the output of EX-NOR 9 to the input of BO. Under this condition, a predetermined data such as "1" applied to the terminal $D_{IN}$ is simultaneously applied to both the bus lines I/O 1 and I/O 2 via the buffer 7 and the circuit 8. Then the data on the bus lines I/O 1 and I/O 2 are simultaneously written into selected memory cells of the arrays 1 and 2. Thus, writing of the same data of the two memory cells is achieved.

When a read operation, i.e. a judging operation in the test mode is conducted, the switches S1 and S2 are both non-conductive and the switch S4 is connected to the output of EX-NOR 9. The switch S3 separates I/O 1 and I/O 2 from the node CN. Read-out data from the arrays 1 and 2 are transferred to I/O 1 and I/O 2 via the column selection circuits 4-1 and 4-2, respectively. In the case where both of the selected memory cells in the arrays 1 and 2 are good, the same data is generated on both of I/O 1 and I/O 2. In this case the EX-NOR 9 generates a "1" level output which is then outputted to $D_{OUT}$ via the switch S4 and BO.

On the contrary, in the case where one of the selected memory cell in the arrays 1 and 3 is bad, such bad memory cell cannot maintain the written data and produces another level of data. For example, when a selected memory cell in the array 1 is bad while a selected memory cell in the array 2 is good, different data are generated on the bus lines 1 and 2. Accordingly, EX-NOR circuit 9 generates a "0" output which is outputted via the switch S4 and the buffer BO to $D_{OUT}$. Thus, either one of the selected cells in the arrays 1 and 2 is indicated to be bad by $D_{OUT}$. In general, the possibility that both of the selected memory cells in the arrays 1 and 3 are bad is extremely small and almost negligible empirically. Therefore, there is not need to pay attention to such possibility in the test. Thus, a plurality of memory cells can be checked simultaneously by the invention.

Figure 2:
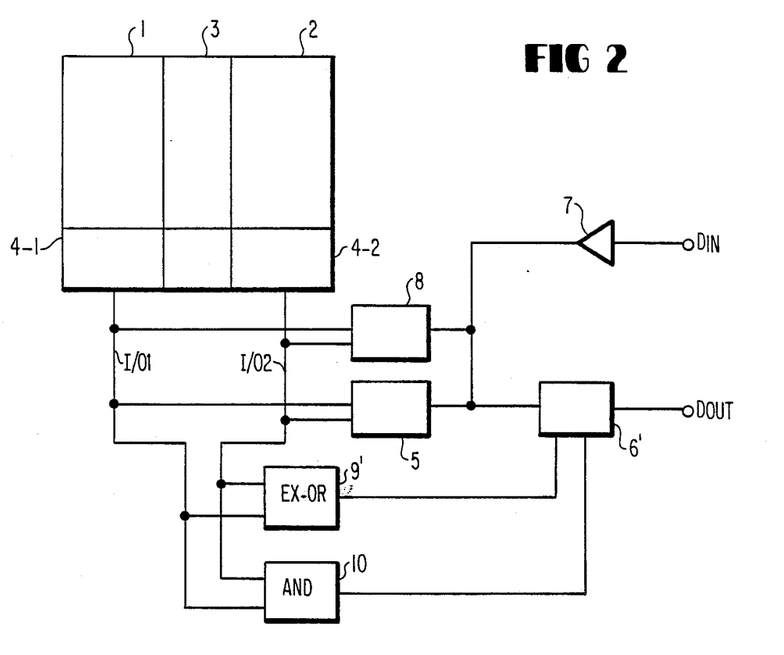
FIG. 2 is a schematic block diagram of a memory device according to a second embodiment of the present invention.

Referring to FIG. 2, a second embodiment of the invention is explained. In FIG. 2, the portions corresponding to those in FIG. 1 are denoted by the same reference numerals. In this embodiment, in place of EX-NOR 9 in FIG. 1, an Exclusive-OR circuit 9' and an AND gate 10 are employed. EX-OR 9' generates a "1" output when data on I/O 1 and I/O 2 are different from each other and a "0" output when data an I/O 1 and I/O 2 are the same in logic level. The AND gate 10 generates a "1" output when both data on I/O 1 and I/O 2 are at logic "1" and a "0" output otherwise.

An output circuit 6' renders $D_{OUT}$ at a high impedance state, i.e. a floating state when the output of EX-OR 9' is at "1" in level, and transmits the output of AND 10 when the output of EX-OR 9' is at "0" in level. Accordingly, in the case where data on I/O 1 and I/O 2 are the same, the kind of the data can be known from the state of $D_{OUT}$.

Figure 3:
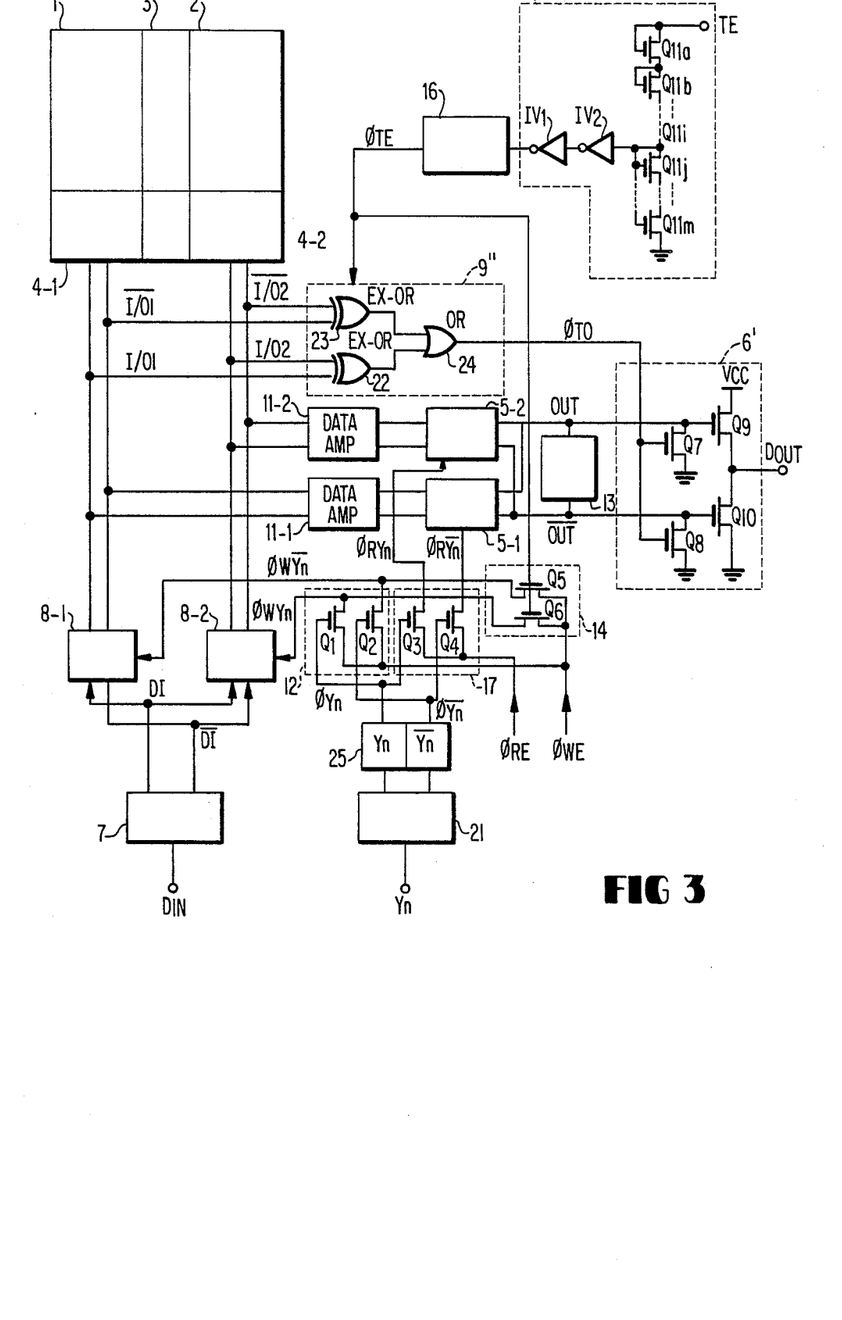
FIG. 3 is a schematic block diagram of a memory device according to a third embodiment of the present invention.

Referring to FIG. 3, a third embodiment of the present invention is described.

In FIG. 3, the portions corresponding to those in the previous embodiments are designated by the same numerals.

A true bus line I/O 1 and a complementary bus line I/O 1 are drawn from a column selection circuit 4-1, while a true bus line I/O 2 and a complementary bus line I/O 2 are drawn from a column selection circuit 4-2. Write circuits 8-1 and 8-2 are provided for the bus line pairs I/O 1, IO 1; I/O2, IO 2, respectively. The write circuits 8-1 and 8-2 receive true and complementary write data DI and $\overline{DI}$ generated by a buffer 7. A comparison circuit 9" includes an Exclusive-OR circuit 22 having inputs coupled to I/O 1 and I/O 2, an Exclusive-OR circuit 23 having inputs coupled to I/O 1 and I/O 2, and an OR gate having inputs connected to the outputs of the EX-OR circuits 22 and 23. The output of the OR gate 24 is taken out as a signal $\phi_{TO}$. Read control circuits 5-1 and 5-2 receives data from the bus line pairs I/O 1, I/O 1; I/O 2, I/O 2 via data amplifiers 11-1 and 11-2, respectively. The read control circuits 5-1 and 5-2 operatively transfer the outputs of the amplifiers 11-1 and 11-2 to a pair of output bus lines OUT and $\overline{OUT}$, respectively. A latch circuit 13 is provided to the lines OUT and $\overline{OUT}$ for holding data on OUT and $\overline{OUT}$. An output circuit 6' is a tri-state output circuit compound of field effect transistors $Q_7$ to $Q_{10}$. A test mode detection circuit 15 includes a plurality of diode-connected field effect transistors $Q_{11a}$ to $Q_{11m}$ coupled between an external terminal TE and a ground potential. When a higher voltage above normal logic level range is applied, a certain potential is generated from a drain of the transistor $Q_{11j}$ which is applied to a driver 16 via inverters IV1 and IV2. When the higher voltage is applied to TE, the driver 16 produces a test signal $\phi_{TE}$ for placing the memory in a test mode.

One column address bit Yn is inputted to an address buffer 21 and latched by a latch circuit 25 in true (Yn) and complementary ($\overline{YN}$) forms. A read block selection circuit 17 has field effect transistors $Q_3$ and $Q_4$. The transistors $Q_3$ transmits a read enable signal $\phi_{RE}$ to the circuit 5-2 as a selection signal $\phi_R Yn$ thereby to enable the circuit when the true column address signal $\phi_{Yn}$ is true. The transistor $Q_4$ transmits $\phi_{RE}$ to the circuit 5-1 as $\phi_{\overline{Yn}}$ in response to $\phi_{\overline{Yn}}$. A write block selection circuit 12 includes field effect transistors for selectively transferring a write enable signal $\phi_{WE}$ to the circuits 8-2 and 8-1 in response to $o_{Yn}$ and $\phi_{\overline{Yn}}$ thereby to enable the circuits 8-2 and 8-1, respectively. A test write circuit 14 includes field effect transistors $Q_5$ and $Q_6$ which transfer $\phi_{WE}$ to both of the circuits 8-1 and 8-2 in response to the test signal $\phi_{TE}$ so that write data is transferred to both of bus line pairs I/O 1 I/O 1 and to I/O 2, I/O 2 simultaneously to achieve a write cycle in the test mode.

When the higher voltage is applied to TE, the test signal $\phi_{TE}$ is generated from the driver 16. When a write cycle is conducted, both of the write circuits 8-1 and 8-2 are enabled because $\phi_{WE}$ is applied thereto via the circuit 14. Thus, the same data is written into selected memory cells in the arrays 1 and 2 simultaneously.

When a read cycle is conducted in the test mode, data from selected memory cells in the arrays are taken-out to the bus line pairs I/O 1, I/O 1 and I/O 2, I/O 2, respectively, which are inputted to the comparison circuit 9″. When both data read from the arrays 1 and 2 are the same, the signal $\phi_{TO}$ is at "0" level. Therefore, the transistors $Q_7$ and $Q_8$ are non-conductive. The above data is transferred to OUT and $\overline{OUT}$ via either of the circuits 5-1 and 5-2 and then outputted to $D_{OUT}$.

On the contrary, when one of selected memory cells in the arrays 1 and 2 is bad while the other is good, data on the bus line pair I/O 1, I/O 1 and data on the bus line pair I/O 2, I/O 2 are different from each other. Accordingly, the comparison circuit 9″ produces a "1" level of 100 $_{TO}$, which renders the transistors $Q_7$ and $Q_8$ conductive. Accordingly, both of the transistors $Q_9$ and $Q_{10}$ are rendered non-conducting. Thus, the output terminal $D_{OUT}$ is set at a high impedance state.

In general, the possibility that both of the selected memory cells in the arrays 1 and 2 are bad is extremely small and almost negligible empirically. Therefore, there is not need to pay attention to such possibility in the test.

Figure 4:
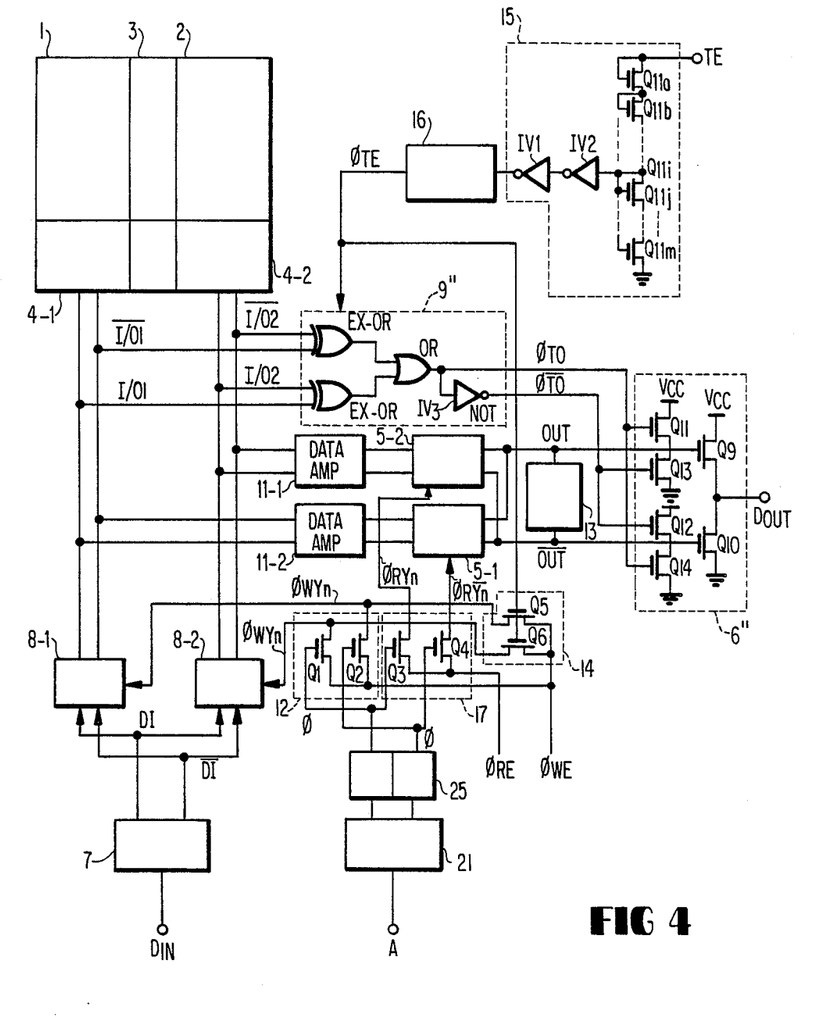
FIG. 4 is a schematic block diagram of a memory device according to a fourth embodiment of the present invention.

FIG. 4 shows a fourth embodiment of the invention. The portions corresponding to those in FIG. 3 are designated by the same reference numerals.

This embodiment is achieved by providing an inverter IV3 for generating a signal $\phi_{\overline{TO}}$ complementary to the signal $\phi_{TO}$. Accordingly, the signal $\phi_{\overline{TO}}$ assumes "1" level when read-out data on the bus line pairs I/O 1 and I/O 2, I/O 2 are the same. Specifically, data on I/O 1 and I/O 2 are the same, e.g. "1," and data on I/O 1 and I/O 2 are the same, e.g. "0". On the contrary, the signal $\phi_{\overline{TO}}$ assumes a "0" logic level when data on the bus line pairs are different. Also, in this embodiment, in place of the transistors $Q_7$ and $Q_8$, four transistors $Q_{11}$ to $Q_{14}$ are employed. The transistors $Q_{11}$ and $Q_{13}$ form a push-pull circuit for driving the gate potential of the transistor $Q_9$ while the transistors $Q_{12}$ and $Q_{14}$ form a push-pull circuit for driving the gate potential of the transistor $Q_{10}$ in complementary manner.

In a read operation in the test mode, when data on both the bus line pairs I/O 1, I/O 1 and I/O 2, I/O 2 are same, $\phi_{TO}$ and $\phi_{\overline{TO}}$ assume "0" and "1" level, respectively. Accordingly, the transistors $Q_{13}$ and $Q_{12}$ are rendered conductive to make the gate potentials of the transistors $Q_9$ and $Q_{10}$ "0" and "1", respectively. Thus, a "0" level output is generated at $D_{OUT}$.

In the case where data on the bus line pair I/O 1, I/O 1 and data on the bus line pair I/O 2, I/O 2 are different, the signals $\phi_{TO}$ and $\phi_{TE}$ assume "1" and "0" logic levels, respectively. Thus, the transistors $Q_{11}$ and $Q_{14}$ are rendered conductive so that the transistor $Q_9$ becomes conductive and a "1" level output is generated at $D_{OUT}$.

As has been described above, according to the present invention, a plurality of memory cells can be tested simultaneously and therefore a test time required for testing a whole memory device can be reduced significantly.

I claim:

1. A memory device comprising first and second groups of memory cells, each of said memory cells being expected to store data written thereto without changing state of the stored data, first and second data lines, a first selection circuit coupled between said first data line and said first group of memory cells for selectively performing data transfer between said first data line and one of said first group of memory cells, a second selection circuit coupled between said second data line and said group of memory cells for selectively performing data transfer between said second data line and one of said second group of memory cells, a data input terminal, a data input buffer having an input terminal coupled to said data input terminal and an output terminal for generating a write data signal, a common data line connected to the output terminal of said input buffer, a first control circuit coupled between said first and second data lines and said common data line, said first control circuit setting the state of one of said first and second data lines in accordance with said write data signal in a normal mode and setting both of said first and second data lines in the same state simultaneously with said write data signal in a test mode, a comparing circuit having a first input terminal connected to said first data line, a second input terminal connected to said second data line and an output terminal, said comparing circuit operatively generating at its output terminal a detection signal of 1 bit data only when data at said first and second data lines are different from each other in said test mode, a second control circuit coupled between said common data line and said first and second data lines for selectively determining a state of said common data line by a state of one of said first and second data lines, a data output terminal, and a data output circuit having an output terminal coupled to said data output terminal, a first input terminal coupled to said common data line and a second input terminal coupled to the output terminal of said comparing circuit, said data output circuit being enabled to generate a data output signal at said data output terminal in accordance with the state of said common data line when said detection signal is not present and disenabled when said detection signal is present thereby to set said data output at a predetermined state irrespective of the state of said common data line.

2. The memory device according to claim 1, in which said predetermined state is a high impedance state.

3. The memory device according to claim 1, in which said comparing circuit includes an Exclusive-OR circuit.

4. The memory device according to claim 1, in which said first control circuit and said second control circuit are controlled by the same address information.

5. A memory device comprising first and second groups of memory cells, each of said memory cells being expected to store data written thereto without changing state of the stored data, first and second data lines, a first selection circuit coupled between said first data line and said first group of memory cells for selectively performing data transfer between said first data line and one of said first group of memory cells, a second selection circuit coupled between said second data line and said group of memory cells for selectively performing data transfer between said second data line and one of said second group of memory cells, a data input terminal, a data input buffer having an input terminal coupled to said data input terminal and an output terminal for generating a write data signal, a common data line connected to the output terminal of said input buffer, a first control circuit coupled between said first and second data lines and said common data line, said first control circuit setting the state of one of said first and second data lines in accordance with said write data signal in a normal mode and setting both of said first and second data lines in the same state simultaneously with said write data signal in a test mode, a comparing circuit having a first input terminal connected to said first data line, a second input terminal connected to said second data line and an output terminal, said comparing circuit operatively generating at its output terminal a detection signal of 1 bit data only when data at said first and second data lines are different from each other in said test mode, a second control circuit coupled between said common data line and said first and second data lines for selectively determining a state of said common data line by a state of one of said first and second data lines, a data output terminal, and a data output circuit having an output terminal coupled to said data output terminal, a first input terminal coupled to said common data line and a second input terminal coupled to the output terminal of said comparing circuit, said data output circuit generating a data output signal at said data output circuit generating a data output signal at said data output terminal in accordance with the state of said common data line in said normal mode, said data output circuit setting said data output terminal at a high impedance state when said detection signal is present in said test mode and generating at said data output terminal the same data signal as the data at said first and second data line when said detection signal is not present in said test mode.

* * * * *

UNITED STATES PATENT AND TRADEMARK OFFICE
CERTIFICATE OF CORRECTION

PATENT NO. : 4,897,817

DATED : 1/30/90

INVENTOR(S) : Katanosaka

It is certified that error appears in the above-identified patent and that said Letters Patent is hereby corrected as shown below:

Column 1, line 32, delete "voltge", insert --voltage--;

line 43, after "present" insert --invention--;

Column 4, line 14, delete "I/O 1", insert --$\overline{I/O\ 1}$--;

line 16, delete "I/O 2", insert --$\overline{I/O\ 2}$--;

line 18, delete "I/O 1, IO 1; I/O 2, IO 2", insert --$\overline{I/O\ 1}$, $\overline{IO\ 1}$; I/O 2, $\overline{IO\ 2}$--;

lines 24 & 25, delete "I/O 1 and I/O 2", insert --$\overline{I/O\ 1}$ and $\overline{I/O\ 2}$--;

line 29, delete "I/O 1, I/O 1; I/O 2, I/O 2", insert --I/O 1, $\overline{I/O\ 1}$; I/O 2, $\overline{I/O\ 2}$--;

line 57, delete "OYn", insert --$\phi$Yn--;

line 62, delete "I/O 1, I/O 1 and to I/O 2, I/O 2", insert --I/O 1, $\overline{I/O\ 1}$ and to I/O 2, $\overline{I/O\ 2}$--;

Column 5, line 5, delete "I/O 1, I/O 1 and I/O 2, I/O 2", insert --I/O 1, $\overline{I/O\ 1}$ and I/O 2, $\overline{I/O\ 2}$--;

UNITED STATES PATENT AND TRADEMARK OFFICE
CERTIFICATE OF CORRECTION

PATENT NO. : 4,897,817

DATED : 1/30/90

INVENTOR(S) : Katanosaka

It is certified that error appears in the above-identified patent and that said Letters Patent is hereby corrected as shown below:

line 14, delete "I/O 1, I/O 1", insert --$\overline{I/O\ 1}$--;

line 15, delete "I/O 2, I/O 2", insert --$\overline{I/O\ 2}$--;

line 17, delete "100 $_{TO}$", insert --$\phi$ $_{TO}$--;

lines 32 & 33, delete "I/O 1 and I/O 2, I/O 2", insert --I/O 1, $\overline{I/O\ 1}$, I/O 2, $\overline{I/O\ 2}$--;

lines 34 & 35, delete "I/O 1 and I/O 2", insert --$\overline{I/O\ 1}$ and $\overline{I/O\ 2}$--;

line 45, delete "I/O 1, I/O 1 and I/O 2, I/O 2", insert --I/O 1, $\overline{I/O\ 1}$ and I/O 2, $\overline{I/O\ 2}$-- lines 51 & 52, delete "I/O 1, I/O 1" and insert --I/O 1, $\overline{I/O\ 1}$--;

line 52, delete "I/O 2, I/O 2", insert insert --I/O 2, $\overline{I/O\ 2}$--;

UNITED STATES PATENT AND TRADEMARK OFFICE
CERTIFICATE OF CORRECTION

PATENT NO. : 4,897,817

DATED : 1/30/90

INVENTOR(S) : Katanosaka

It is certified that error appears in the above-identified patent and that said Letters Patent is hereby corrected as shown below:

line 53, delete "$\phi_{TE}$", insert --$\overline{\phi_{TE}}$--.

Signed and Sealed this

Fifteenth Day of October, 1991

*Attest:*

*Attesting Officer*

HARRY F. MANBECK, JR.

*Commissioner of Patents and Trademarks*